United States Patent
Chen et al.

(10) Patent No.: US 10,101,853 B2
(45) Date of Patent: Oct. 16, 2018

(54) DISPLAY WITH SHALLOW CONTACT HOLES AND REDUCED METAL RESIDUE AT PLANARIZATION LAYER STEPS

(71) Applicant: Apple Inc., Cupertino, CA (US)

(72) Inventors: Yu Cheng Chen, San Jose, CA (US); Keitaro Yamashita, Nishinomiya (JP); Abbas Jamshidi Roudbari, Sunnyvale, CA (US); Hirokazu Yamagata, Adachi (JP); Ting-Kuo Chang, San Jose, CA (US)

(73) Assignee: Apple Inc., Cupertino, CA (US)

( * ) Notice: Subject to any disclaimer, the term of this patent is extended or adjusted under 35 U.S.C. 154(b) by 5 days.

(21) Appl. No.: 15/260,137

(22) Filed: Sep. 8, 2016

(65) Prior Publication Data

US 2017/0351379 A1    Dec. 7, 2017

Related U.S. Application Data

(60) Provisional application No. 62/345,550, filed on Jun. 3, 2016.

(51) Int. Cl.
*H01L 27/12* (2006.01)
*G06F 3/041* (2006.01)
*G06F 3/044* (2006.01)

(52) U.S. Cl.
CPC ............ *G06F 3/0418* (2013.01); *G06F 3/044* (2013.01); *G06F 3/0412* (2013.01); *H01L 27/124* (2013.01); *G06F 2203/04111* (2013.01)

(58) Field of Classification Search
CPC ..... G06F 3/0412; G06F 3/044; H01L 27/124; G02F 1/13458
See application file for complete search history.

(56) References Cited

U.S. PATENT DOCUMENTS

| | | | |
|---|---|---|---|
| 9,638,949 B1 * | 5/2017 | Kim | .................... G02F 1/13338 |
| 2003/0111703 A1 | 6/2003 | Chang et al. | |
| 2006/0046374 A1 | 3/2006 | Chen et al. | |
| 2007/0176170 A1 | 8/2007 | Ho et al. | |
| 2012/0268396 A1 | 10/2012 | Kim et al. | |

(Continued)

FOREIGN PATENT DOCUMENTS

JP    2002182238    6/2002

*Primary Examiner* — Xuemei Zheng
(74) *Attorney, Agent, or Firm* — Treyz Law Group, P.C.; G. Victor Treyz; David K. Cole

(57) ABSTRACT

Thin-film transistor circuitry for a display may include conductive layers such as transparent conductive layers and metal layers and may include dielectric layers. The dielectric layers may include buffer layers, interlayer dielectric, gate insulator, and organic planarization layers. The organic planarization layers may be patterned photolithographically to form vias, trenches, and other structures. Trenches may be formed by removing the planarization layer in a strip. When planarization material is removed for forming a trench or other structure, a step is formed in the planarization material. Metal lines such as data lines and other signal lines may cross steps in the planarization material. To prevent shorts between lines, a step may have protrusions that help eliminate metal etch residue. Vias may be reduced in depth by forming metal bumps and dielectric bumps under the vias and by forming other via structures.

13 Claims, 10 Drawing Sheets

(56) References Cited

U.S. PATENT DOCUMENTS

2015/0055051 A1* 2/2015 Osawa ............... H01L 27/1225
　　　　　　　　　　　　　　　　　　　　　349/48
2016/0274693 A1* 9/2016 Liu ..................... G06F 3/044
2017/0185193 A1* 6/2017 Kim .................... G06F 3/0412

* cited by examiner

DISPLAY WITH SHALLOW CONTACT HOLES AND REDUCED METAL RESIDUE AT PLANARIZATION LAYER STEPS

The application claims the benefit of provisional patent application No. 62/345,550, filed Jun. 3, 2016, which is hereby incorporated by reference herein in its entirety.

BACKGROUND

This relates generally to electronic devices and, more particularly, to electronic devices with displays.

Electronic devices often include displays. For example, computers, cellular telephones, and other devices may use displays to present visual information to a user. It may be desirable to provide displays with structures for preventing moisture intrusion, vias, and other structures. Unless care is taken, these structures may add undesired complexity to the fabrication processes used in forming a display or may reduce display reliability.

SUMMARY

A display may have an array of pixels. The pixels may be formed from thin-film transistor circuitry on a substrate. The thin-film transistor circuitry may include conductive layers and dielectric layers. The conductive layers may include transparent conductive layers such as indium tin oxide layers and may include metal layers. The transparent conductive layers may be used to form pixel electrodes and a common voltage electrode for the array of pixels and may be used in forming capacitive touch sensor electrodes. The metal layers may be used in forming transistor terminals, signal lines, and other structures. The dielectric layers may include buffer layers, interlayer dielectric layers, gate insulator, and organic planarization layers.

The organic planarization layers may be patterned photolithographically to form vias, trenches, and other structures. To ensure that metal can effectively extend down the sidewalls of vias to form contacts with metal structures at the bottom of the vias, the vias may be reduced in depth. The vias may, for example, be reduced in depth by forming metal bumps and dielectric bumps under the vias and by forming other structures in the vias.

Trenches may be formed in the planarization layer. When planarization material is removed to form a trench or other structure, a step is formed at the edge of the planarization material. Metal lines such as data lines for the pixels and other signal lines for the display may cross steps in planarization layer material. To prevent shorts between lines, a step may have protrusions that help eliminate metal residue between the lines following etching. Trenches may also be segmented to form trench segments. Metal lines may pass through non-trenched areas between the trench segments.

DETAILED DESCRIPTION

Figure 1:
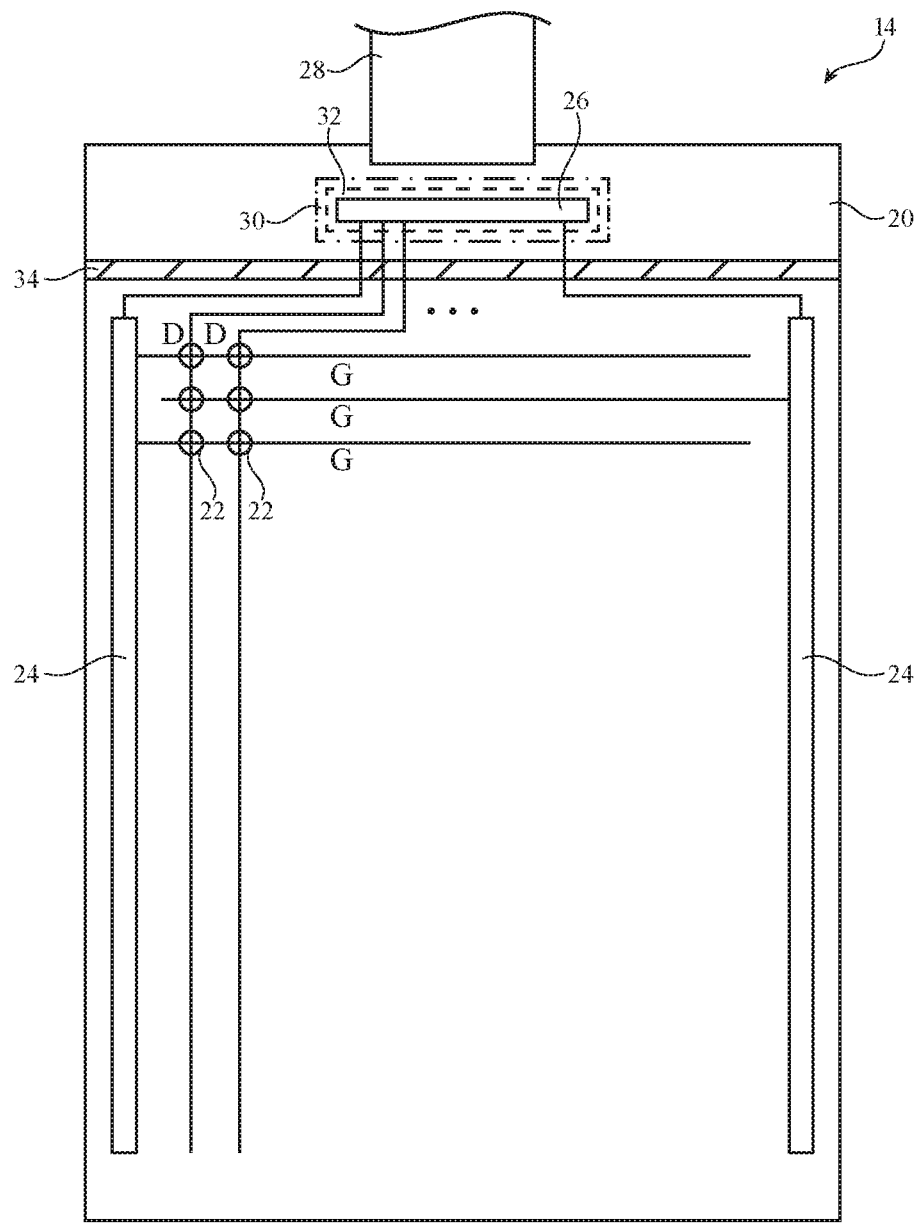
FIG. 1 is a top view of an illustrative display in accordance with an embodiment.

A display may be used in an electronic device such as a laptop computer, a tablet computer, a cellular telephone, a wristwatch, or other electronic device (e.g., a portable device, handheld device, etc.). An illustrative display of the type that may be used in electronic devices such as these is shown in FIG. 1. Display 14 may be a liquid crystal display, an organic light-emitting diode display, or any other suitable type of display. Display 14 may be a touch screen display that incorporates an array of capacitive touch sensor electrodes, may have other types of touch sensor, or may be insensitive to touch. Illustrative configurations in which display 14 is a liquid crystal display with a capacitive touch sensor array may sometimes be described here as an example. This is, however, merely illustrative. Display 14 may be any suitable type of display and vias, trenches, and other features that are described as being formed in display 14 may also be formed on printed circuit boards, integrated circuits, touch sensors, and other components, if desired.

As shown in FIG. 1, display 14 may have an array of pixels such as pixels 22. Pixels 22 may be arranged in rows and columns. Data lines D may supply data to columns of pixels 22. Rows of pixels may be controlled using one or more horizontal control lines such as gate lines G. Gate driver circuitry 24 may be located along the left and/or right edges of display 14 and may be used to supply control signals on gate lines G. Display driver circuitry 26 may be located along the upper edge of display 14 (as an example) and may be used in generating data signals on data lines D and control signals for gate driver circuitry 24. Circuitry 24 and/or circuitry 26 may be formed from thin-film circuitry and/or integrated circuits. For example, circuitry 24 may be formed from thin-film transistor circuits formed on substrate 20 and circuitry 26 may be formed from one or more integrated circuits that are soldered to contact pads on substrate 20. Circuitry 24 and/or circuitry 26 may also be mounted on external substrates and coupled to substrate 20 using flexible printed circuit cables or other cables.

Display driver circuitry 26 may receive image data from control circuitry in an electronic device. The image data may correspond to image to be displayed on display 14. Image data may be received from the control circuitry via flexible printed circuit cable 28 or other signal path. Cable 28 may be coupled to pads on substrate 20 of display 14.

Using the received image data, display driver circuitry 26 may supply data signals to data lines D and may supply control signals to gate driver circuitry 24. Data lines D and other signal lines may extend between display driver circuitry 26 and gate driver circuitry 24 and pixels 22. These signal lines may be formed from metal lines.

Display 14 may have one or more planarization layers. For example, display 14 may have multiple planarization layers to help accommodate an additional layer of metal signal lines in display 14 (e.g. a layer of lines that is sandwiched between first and second planarization layers). In some portions of display 14, it may be desirable to remove some or all of the planarization layer material from substrate 20. For example, it may be desirable to remove some of the planarization layer in ring-shaped region 30 surrounding display driver circuitry 26 and it may be desirable to remove all planarization layer material in rectangular region 32 (e.g., to allow circuit 26 to be soldered to contacts on substrate 20). It may also be desirable to remove all planarization layer material in a strip such as trench 34 that extends across substrate 20. The removal of the planarization layer material in trench 34 may help prevent moisture intrusion through the planarization layer material into the active area of display 14.

In configurations for display 14 that have regions with selectively removed planarization layer material, the metal lines in display 14 may sometimes cross the edges of the planarization layers. The planarization layers may have non-negligible thicknesses, so that challenges may arise when routing signal lines across areas where the planarization layers change in thickness.

Structures may be included in display 14 to ensure that satisfactory metal line structures are formed even in the presence of these planarization layer edges. For example, bumps or other structures may be placed under vias to help ensure that the vias are sufficiently shallow to form reliable contacts and planarization layer edges may be provided with protrusions that help ensure that undesirable shorts do not form due to inadequate metal residue removal along the planarization layer edges.

Figure 2:
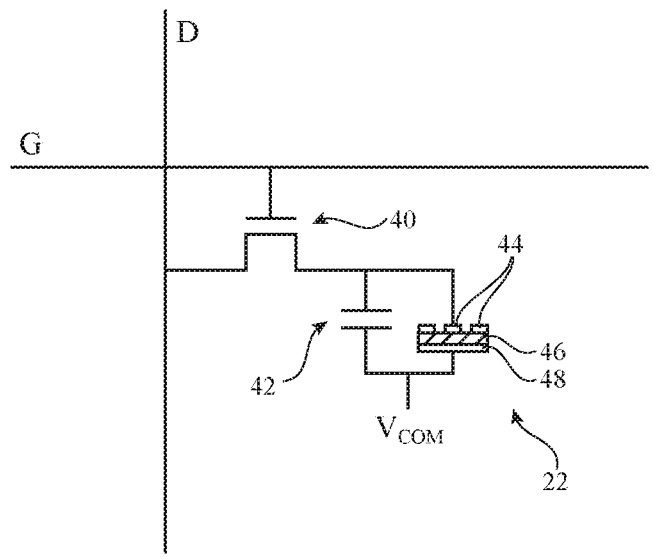
FIG. 2 is a diagram of an illustrative pixel circuit in accordance with an embodiment.

FIG. 2 is an illustrative pixel circuit for pixels 22. In the example of FIG. 2, pixel 22 is a liquid crystal display pixel. If desired, pixels 22 may be organic light-emitting diode display pixels or pixels for other types of displays.

As shown in FIG. 2, pixel 22 may have liquid crystal material 46. Liquid crystal material 46 may be sandwiched between a color filter layer and a thin-film transistor layer. The thin-film transistor layer may include thin-film transistors and other thin-film circuitry for forming pixel circuit 22. The color filter layer may include an array of color filter elements that provide display 14 with the ability to display color images. The color filter layer and the thin-film transistor layer may be sandwiched between upper and lower polarizers and may be backlit with light from a backlight unit.

Thin-film transistor 40 may be used to load data from data line D into storage capacitor 42 in response to assertion of a control signal on gate line G. The voltage on each capacitor 42 is used to apply an electric field to a pixel-sized portion of liquid crystal layer 46. In the example of FIG. 2, the voltage on capacitor 42 of pixel 22 is applied to liquid crystal layer 46 using electrode fingers (pixel electrode) 44 and common voltage (Vcom) electrode 48. Other electrode configurations may be used, if desired.

Figure 3:
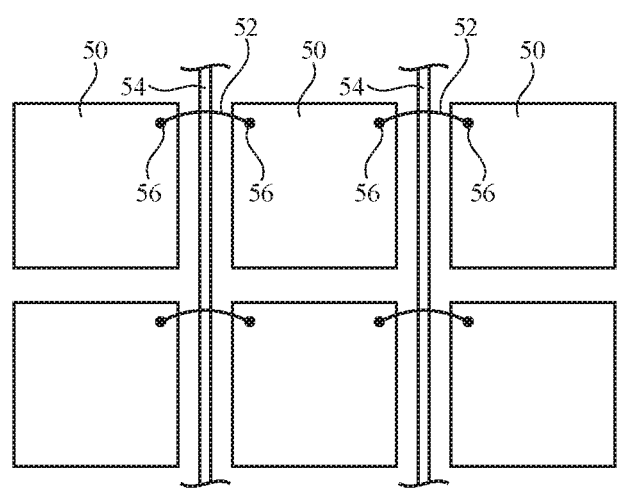
FIG. 3 is a diagram of illustrative touch sensor circuitry for a display in accordance with an embodiment.

Electrodes such as electrode 44 and 48 of FIG. 3 may be formed from transparent conductive material such as indium tin oxide or other conductive structures. If desired, the layer of indium tin oxide that is used in forming Vcom electrode 48 or other conductive structures in display 14 may be used to form an array of capacitive touch sensor electrodes. An illustrative array of capacitive touch sensor electrodes that can be used to form a touch sensor for display 14 is shown in FIG. 3. In the example of FIG. 3, electrodes 50 and 54 are formed from indium tin oxide (e.g., portions of layer 48). Pads 50 of layer 48 may be shorted together using horizontal shorting lines 52 to form horizontal electrodes for the touch sensor. Vertical electrodes 54 for the touch sensor are electrically isolated from pads 50 and shorting lines 52. Lines 52 may be formed from a patterned metal layer in display 14. Vias (contacts) 56 may be used to couple lines 52 to pads 50. Pads 50 may each overlap an N×M section of pixels 22 in the array of pixels in display 14. The values of N and M may be, for example, 10-500, more than 20, less than 100, etc.

Figure 4:
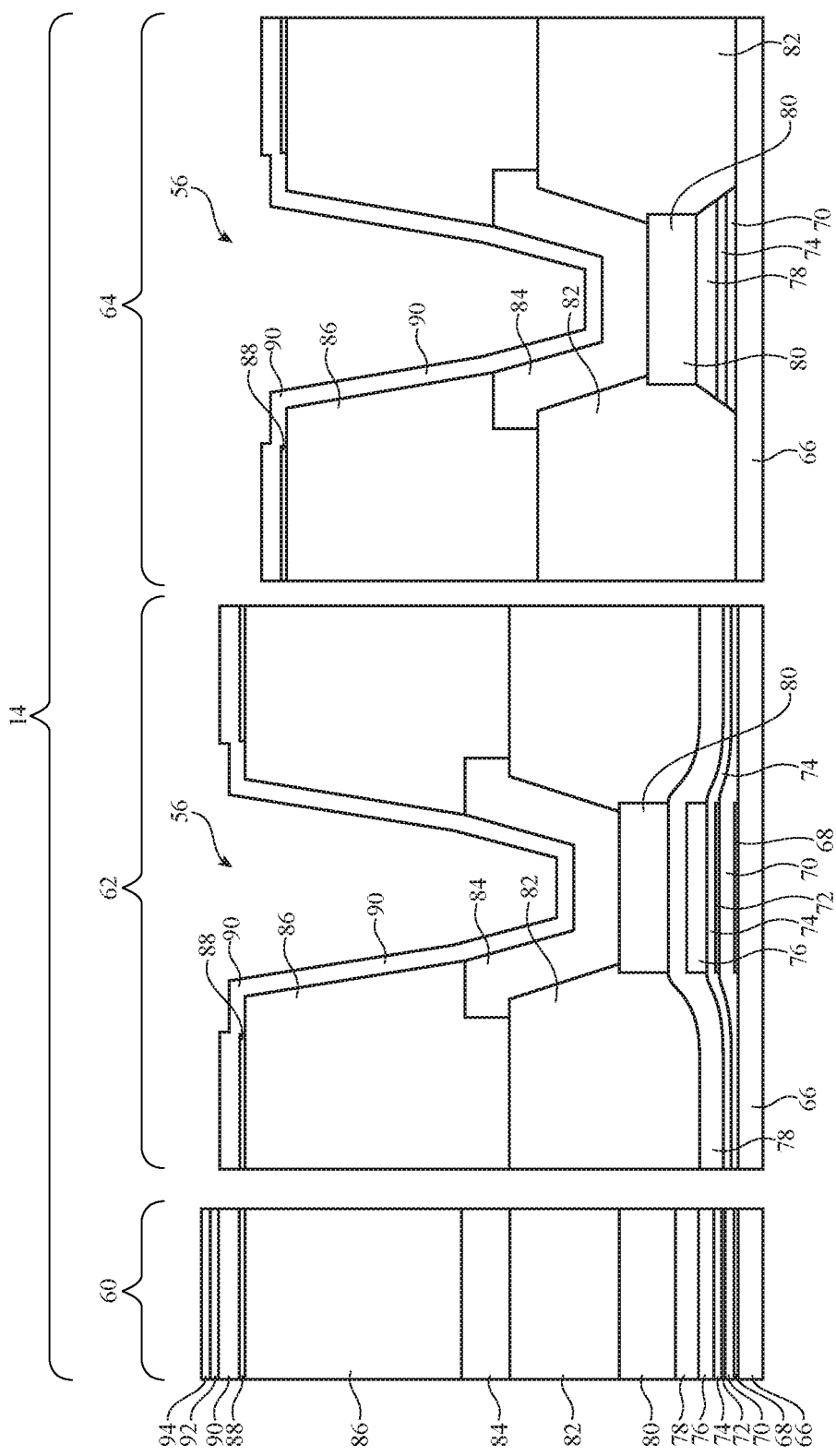
FIG. 4 is a cross-sectional side view of thin-film layers that may be used in forming pixel circuits and other thin-film circuitry in a display in accordance with an embodiment.

Illustrative thin-film circuitry of the type that may be used in forming display 14 is shown in FIG. 4. Different portions of display 14 may have different stacks of layers (see, e.g., the illustrative stackups in regions 60, 62, and 64). In region 60, no vias are present. Regions 62 and 64 have illustrative vias 56. Display 14 may have vias such as vias 56 of region 62, may have vias such a vias 56 of region 64, and/or may have other vias 56.

Vias 56 may be used to couple indium tin oxide layer 88 (e.g., portions of layer 88 forming pads 50) to metal lines formed from metal layer 80. Metal layer 80 may, as an example, form lines 52 of FIG. 3. Metal layer 90 may extend down the sidewalls of via 56 and be used to short layer 88 (pads 50) to layer 80 (lines 52). Metal layer 90 may also be patterned in a mesh on top of layer 88 (over pads 50) to reduce the sheet resistance of pads 50.

The layers of material in regions such as regions 60, 62, and 64 may be formed on substrate layer 66 (e.g., substrate 20 of FIG. 1). Substrate layer 66 may be a clear layer of glass, plastic, or other substrate material. Liquid crystal material may be formed in a layer above layer 90 and below a color filter layer (as an example). Backlight illumination may be provided from below layer 66.

Metal layer 68 may be a thin metal layer that is used for light shielding. For example, metal layer 68 may be a metal layer with a thickness of 50-100 nm, more than 50 nm, or less than 100 nm. Layer 68 may be sufficiently thick to be opaque and may be placed under the active areas of transistors such as transistor 40 of FIG. 2 to shield the transistors from light.

Buffer layer 70 may be formed over layer 68. Buffer layer 70 may be formed from silicon oxide, silicon nitride, other inorganic dielectric material, or other suitable dielectric.

Layer 72 may be formed from polysilicon or other semiconductor and may be used in forming the active areas of thin-film transistors in display 14 (see, e.g., transistor 40 of FIG. 2).

Gate insulator layer 74 may be formed over layer 72 and may be a silicon oxide layer or other inorganic dielectric layer.

Gate metal layer 76 may be used for forming structures such as the gates of transistors 40 and other display transistors and may form other conductive paths such as gate lines G of FIG. 1.

Interlayer dielectric layer 78 may be formed from silicon oxide, silicon nitride, and/or other inorganic dielectric layers and may be deposited after gate metal layer 76.

In vias such as vias 56, bumps (pads) of metal 76, bumps of dielectric 78, and other structures may be formed under other via structures to help reduce the depth (height) of vias 56 and thereby ensure that metal layer 90 is able to satisfactorily form a short circuit path along the sidewalls of the via. In the example of FIG. 4, a bump formed from metal layer 76 is located under via 56 of region 62 to help reduce the depth of via 56 of region 62 and a bump formed from dielectric layer 78 is located under via 56 of region 64 to help reduce the depth of via 56 in region 64.

Metal layer 80 may be used in forming metal lines such as touch sensor routing lines (e.g., lines such as lines 52 of FIG. 3) and may be formed after depositing layer 78.

Planarization layers 82 and 86 may have thicknesses of 2-4 microns, more than 2 microns, less than 5 microns, or other suitable thicknesses. Planarization layers 82 and 86 may be formed from organic materials such as photoimageable polymers. In regions such as region 62 or 64, openings may be formed in layers 82 and 86 to accommodate vias 56 or other structures. Planarization layers 82 and/or 86 may also be fully or partially removed in regions such as regions 30, 32, and 34 of FIG. 1.

Reductions in the depths of vias 56 help ensure that metal layer 90 can form a satisfactory conductive path down the sidewalls of via 56 to the metal layer(s) at the bottom of the via such as layer 80. The depths of vias 56 may be reduced by forming metal layer 76 under vias 56. For example, a square pad or other bump structure such as the illustrative bump formed by layer 76 in region 62 may be formed under via 56. Portions of dielectric layer 78 may, if desired, be formed between metal layer 76 and metal layer 80 in via 56 of region 62. The inclusion of a square region or other portion of metal layer 84 between metal layers 80 and 90 may also help decrease the depth of via 56. In the illustrative configuration of region 64, via 56 does not include metal layer 76 to help decrease the depth of via 56, but has a bump formed from dielectric 78 under via 56 to help raise the surface of layer 80. Bumps such as the illustrative metal bump of layer 76 in region 62 and the illustrative dielectric bump of layer 78 in region 64 may be used separately, may be used together, and/or may be used with other illustrative via-depth-reducing structures. The outlines (footprints when viewed from above) of via-depth-reducing structures such as these may be rectangular, may be circular, may have a combination of straight and curved edges, or may have other suitable shapes. The thicknesses of layer 76 and layer 78 may be, for example, about 0.2 to 0.5 microns, more than 0.1 microns, less than 0.7 microns, or other suitable thickness.

FIGS. 5, 6, 7, and 8 are cross-sectional side view of illustrative vias 56 in which structures have been provided under vias 56 to help reduce the depth of vias 56 (i.e., to reduce the distance to the upper surface of the metal layer being contacted by layer 90). Vias 56 with configurations of the types shown in FIGS. 5, 6, 7, and 8 (and FIG. 4) may be used in integrated circuits, displays, touch sensors, touch screen displays, printed circuit boards, or any other structures that include vias.

Figure 5:
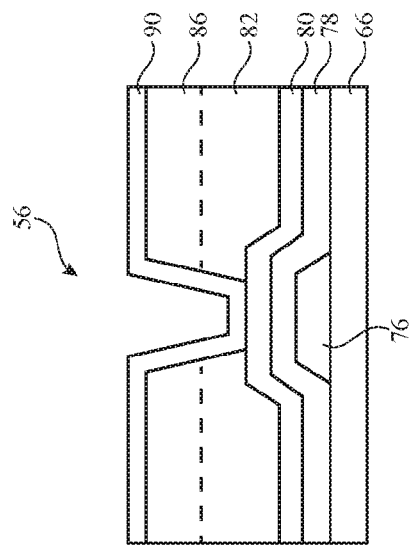
FIGS. 5, 6, 7, and 8 are cross-sectional side views of illustrative contacts in a display in accordance with an embodiment.

In the example of FIG. 5, none of metal layer 84 is present in via 56 and none of interlayer dielectric layer 78 is present in via 56, thereby simplifying the structure. A via-depth-reduction structure is formed from a portion of metal layer 76 that creates a pad (bump) under metal layer (line) 80.

Figure 6:
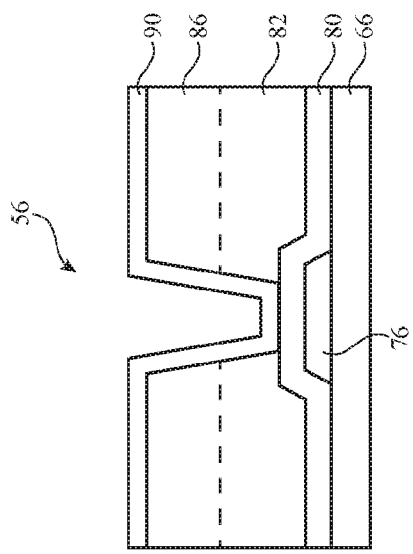

In the example of FIG. 6, dielectric layer 78 is present under via 56. The portion of layer 78 under via 56 may form part of a blanket film (as shown in FIG. 6) or may be a bump, as shown under via 56 in region 64 of FIG. 4. Metal layer 76 may form a bump that helps reduce the depth of via 56. Metal layer 84 has been omitted to reduce complexity.

Figure 7:
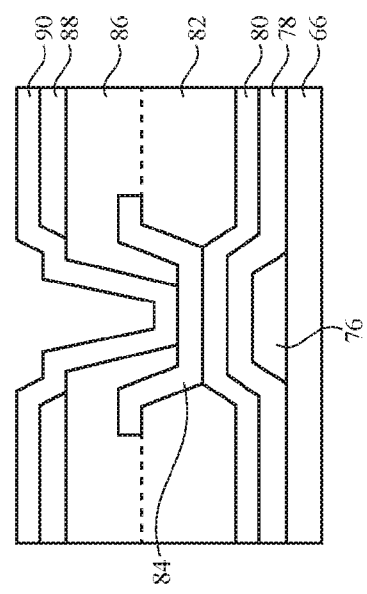

In the example of FIG. 7, metal layers 84 and 76 help reduce via depth. Dielectric layer 78 has been omitted to reduce complexity.

Figure 8:
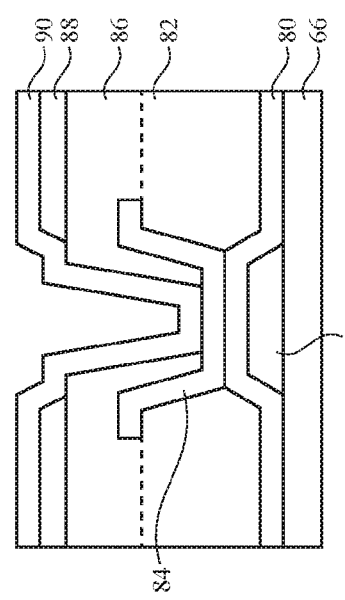

In the illustrative configuration of FIG. 8, metal layer 76, interlayer dielectric layer 78, and metal layer 84 are present and help reduce via depth.

Vcom layer 88 may be present under layer 90 in vias 56 (as shown in FIGS. 7 and 8) or may not be present under layer 90 in vias 56 (as shown in FIGS. 5 and 6).

As described in connection with regions 30, 32, and 34 of FIG. 1, planarization layers such as layers 82 and/or 86 may be selectively removed from areas of display 14. Metal lines such as data lines D and other lines may run across the edges of planarization layer steps formed by selectively removing portions of layers 82 and/or 86. Etching (e.g., dry etching such as plasma etching, etc.) may be used to remove indium tin oxide and other transparent conductive materials, metal, and other conductive materials as part of the process of forming metal lines and during other fabrication steps. This creates a risk that residual metal filaments may be formed along the edge a planarization layer.

Figure 9A:
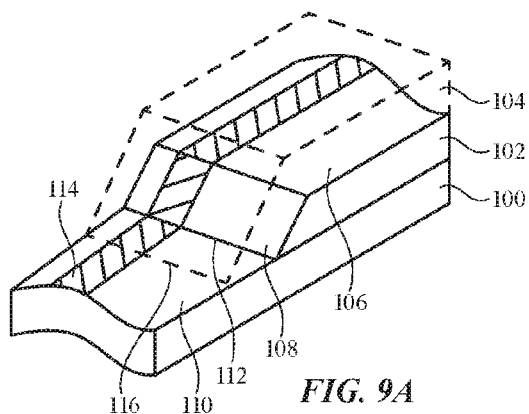
FIG. 9A is a perspective view of a metal line running across a planarization layer step in accordance with an embodiment.

Consider, as an example, an arrangement of the type shown in FIG. 9A. In FIG. 9A, a substrate and/or other layers (shown as layer 100) is partly covered by planarization layer 102. A region of planarization layer 102 has been removed from layer 100, thereby forming planarization layer step (edge) 108. The surface of step 108 extends downward from planarization layer upper surface 106 to surface 110 of layer 100. During fabrication, a layer of conductive material (e.g., metal) may be deposited as a blanket film. Photoresist on the blanket metal film may then be patterned in the shape of lines or other structures. Etching may be used to remove uncovered metal areas. This photolithographic patterning process forms metal lines such as illustrative metal line 114 that run across step 108 of layer 102 (i.e., the exposed edge surface of layer 102) from planarization layer surface 106 to surface 110 of layer 100.

Challenges arise in completely removing unwanted portions of the metal film used in forming lines 114. When etching away the metal film, the geometry of step 108 tends to reduce etching efficiency along lower edge 112 of step 108. There is therefore a risk that unwanted metal residue will remain along edge 112 following patterning of the metal film to form lines such as line 114. If care is not taken, this metal residue will short adjacent lines together.

To help ensure that no possible shorting paths remain between adjacent lines 114 following metal etching, planarization layer 102 (e.g., layer 82 of FIGS. 4, 5, 6, 7 and 8 and/or other suitable planarization layers) may be provided with one or more protrusions. The protrusions may extend outwardly from the edge surface of layer 102 that forms step 108 as shown by protrusions 120 of FIGS. 9B and 9C. The presence of protrusions 120 helps ensure that there will be an open circuit between adjacent metal lines 114. If desired, additional planarization layer material may be formed above layer 102. For example, additional planarization layer 104 of FIGS. 9A, 9C, and 9D (see, e.g., layer 86 of FIGS. 4, 5, 6, 7, and 8) may overlap layer 102 and step 108. This gives rise to a risk that metal residue will form along edge 116 of layer 104 when indium tin oxide, metal films, and other blanket layers are removed from layer 104 during processing. To ensure that adjacent lines 114 remain isolated from each other, layer 104 may also be provided with protrusions such as protrusions 120 of layer 102 or protrusions 120 of layer 102 may be extended sufficiently to protrude out from under the edge of layer 104.

Figure 9B:
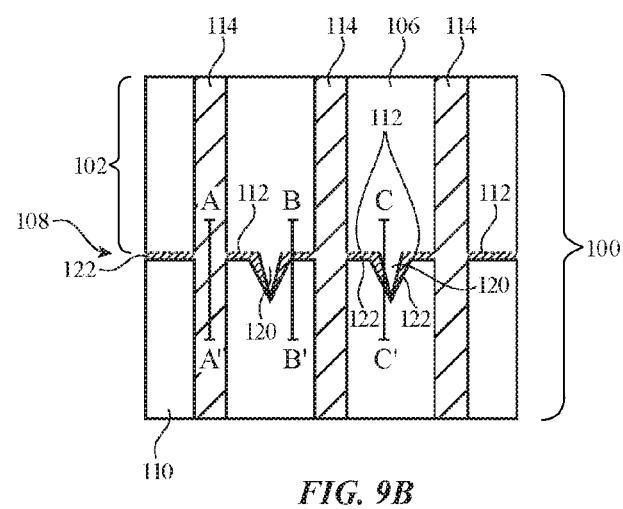
FIG. 9B is a top view of a planarization layer step having planarization layer protrusions to ensure that metal is removed between adjacent metal lines along the edge of the step in accordance with an embodiment.
Figure 9C:
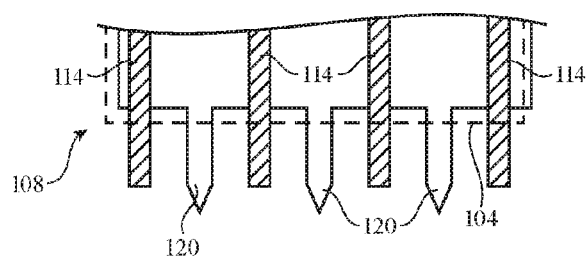
FIG. 9C is a top view of an illustrative planarization layer with protrusions in accordance with an embodiment.
Figure 9D:
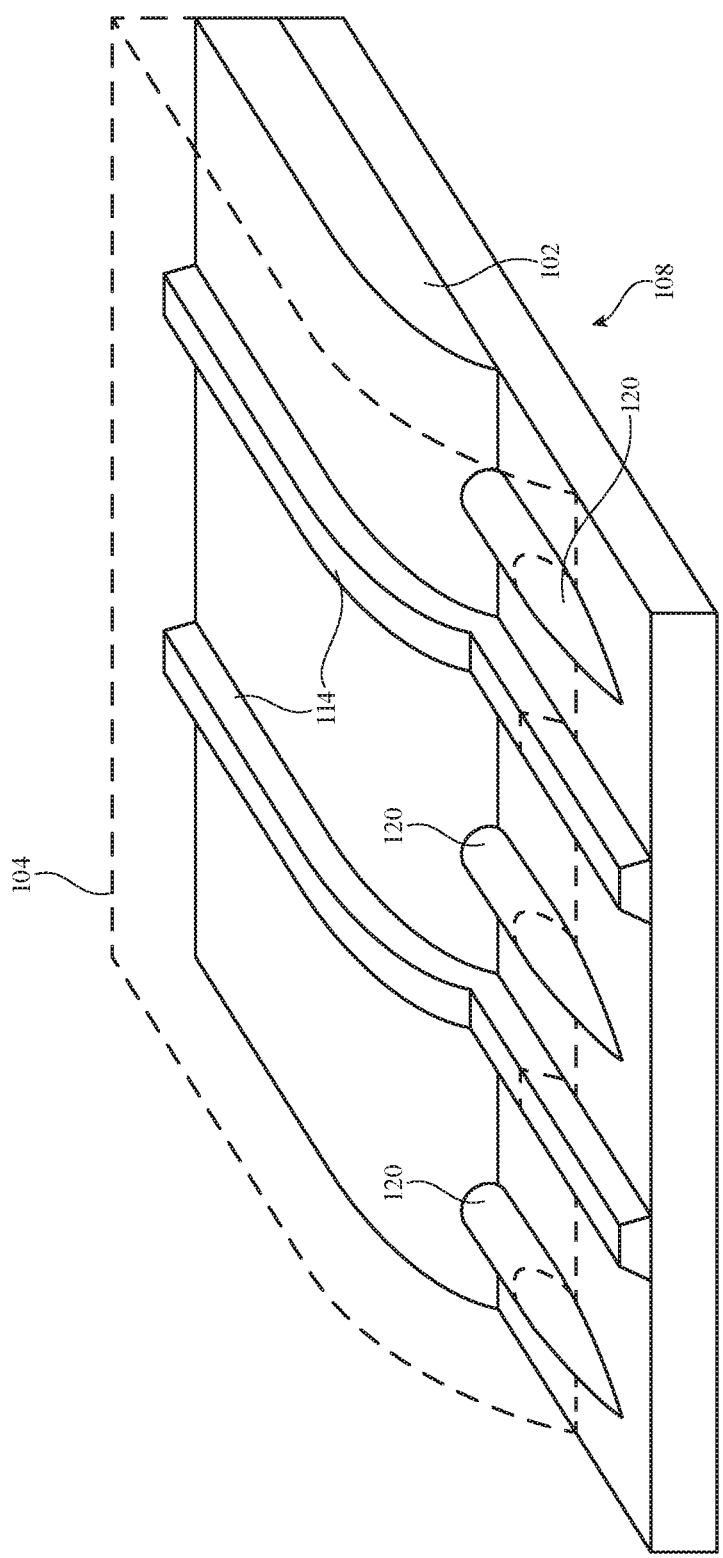
FIG. 9D is a perspective view of an illustrative planarization layer with protrusions in accordance with an embodiment.
Figure 10:
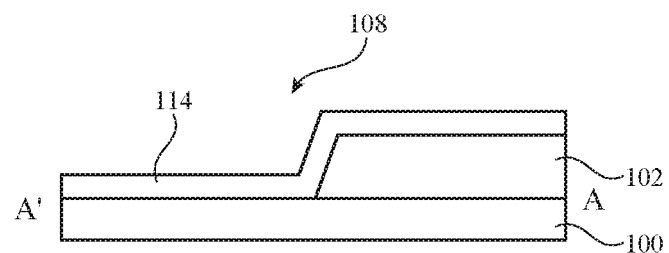
FIGS. 10, 11, and 12 are cross-sectional side view of illustrative portions of the structures of FIG. 9B in accordance with an embodiment.
Figure 11:
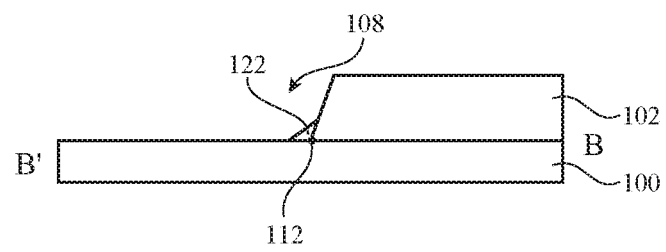
Figure 12:
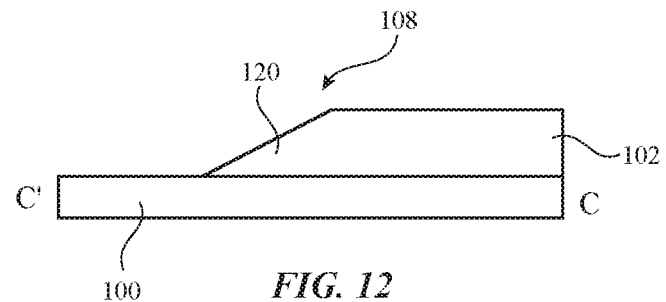

As shown in the top view of FIG. 9B and the perspective view of FIG. 9D, there may be at least one of protrusions 120 between each pair of adjacent metal lines 114. Metal residue 122 may form along edge 112, but is completely removed at the tip of protrusion 120 because protrusion 120 is more gradually sloped than step 108 (e.g., protrusion 120 may have a tapered tip) and thereby facilitates etching of any metal formed on protrusion 120. As shown in the cross-sectional side views of FIGS. 10, 11, and 12, which correspond to views of the structures of FIG. 9B taken, respectively, along lines A-A', B-B', and C-C', this arrangement ensures that metal lines 114 will be satisfactorily formed across step 108 (FIG. 10) and that any metal residue 122 that may remain along edge 112 of step 108 in non-protruding portions of step 108 (FIG. 11) will be completely removed adjacent to the portion of planarization layer 102 that forms protrusion 120 (FIG. 12). Protrusions such as protrusion 120 extend outwardly from the edge surface of layer 102 that forms step 108. The outline of protrusions 120 may be triangular, as shown in FIG. 9B, or may have a more elongated shape, as shown in FIGS. 9C and 9D, in which protrusion 120 has an elongated shape with a tapered tip (e.g., a tip that decreases in width and thickness when approaching its pointed end).

Planarization layer steps such as step 108 may be located on both sides of planarization layer trenches such as trench 34 of FIG. 1. In this type of configuration, metal lines 114 that extend over trench 34 may cross a first step 108 on one edge of the trench and may cross a second step 108 on an opposing edge of the trench. Both trench edges in this type of arrangement may have planarization layers with protrusions 120 (i.e., planarization layer protrusions 120 may extend into trench 34 from both sides).

Figure 13:
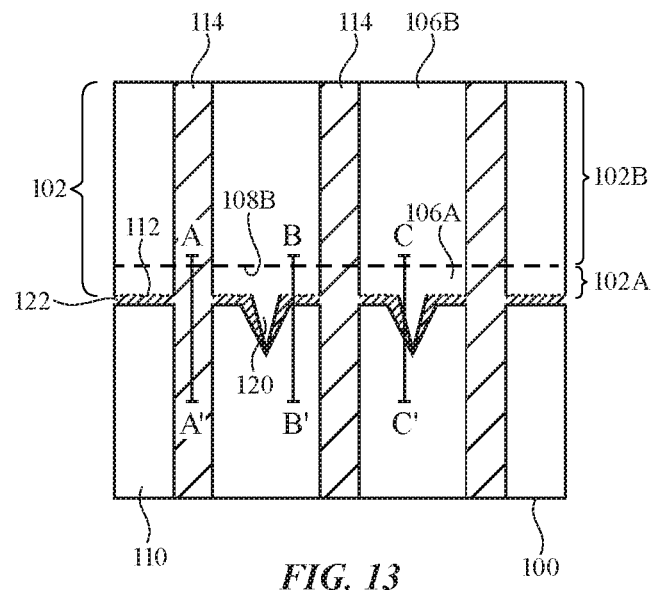
FIG. 13 is a top view of an illustrative planarization layer step formed using a halftone mask in accordance with an embodiment.
Figure 14:
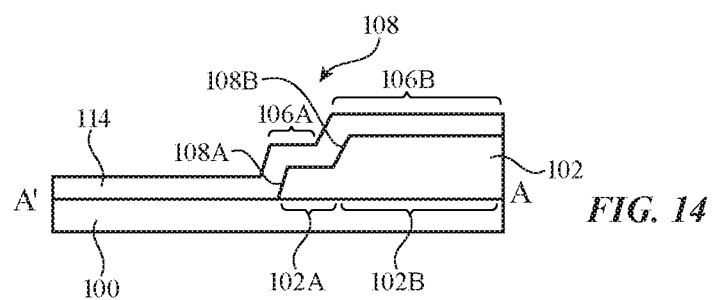
FIGS. 14, 15, and 16 are cross-sectional side views of illustrative portions of the structures of FIG. 13 in accordance with an embodiment.
Figure 15:
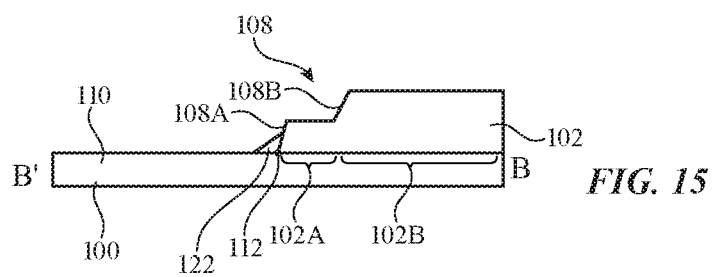
Figure 16:
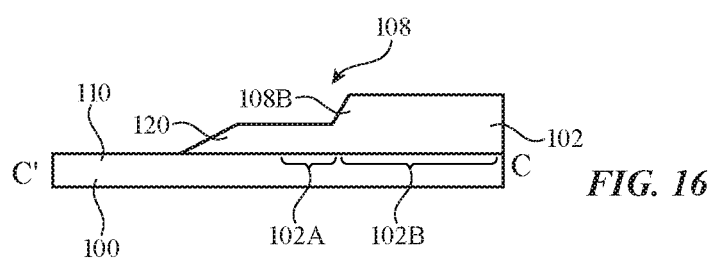

In some arrangements, planarization layer 102 may be photolithographically patterned using a halftone mask. As shown in FIG. 13, for example, a halftone mask may be used to pattern layer 102 so that layer 102 has thicker portion 102B and thinner portion 102A at step 108. Surface 106B of layer portion 102B may be separated from surface 106A of layer portion 102A by step portion 108B of step 108 and surface 106A of layer portion 102A may be separated from surface 110 of layer 100 by step portion 108A of step 108. To prevent metal residue at edge 112 of step 108 from shorting adjacent lines 114, protrusion 120 may be formed in layer portion 102B of planarization layer 102. As with the arrangement of FIG. 9B, there may be at least one of protrusions 120 between each pair of adjacent metal lines 114. FIG. 14 shows how metal line 114 may cross step portions 108A and 108B of step 108. As shown in FIG. 15, metal residue 122 may form along edge 112. This residue is, however, completely removed at the tapered tip of protrusion 120 as shown in FIG. 16.

Figure 17:
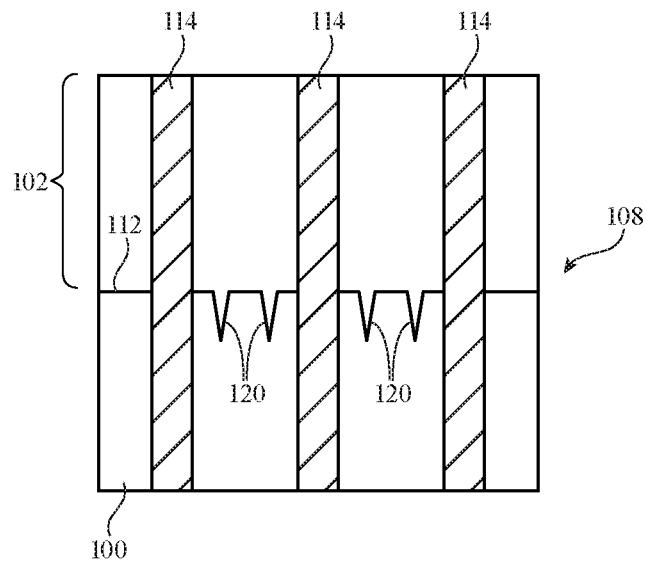
FIGS. 17 and 18 are top views of illustrative protrusion shapes that may be used in a planarization layer in accordance with an embodiment.
Figure 18:
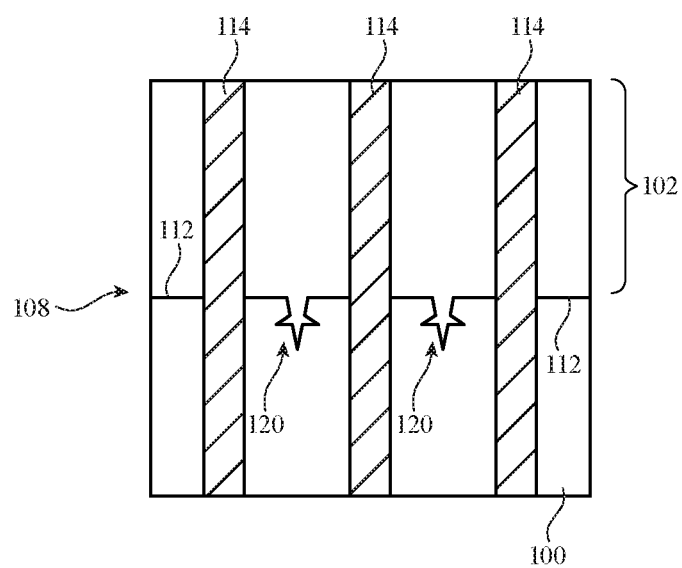

If desired, multiple protrusions 120 may be formed between each pair of adjacent metal lines 114, as illustrated in FIG. 17. FIG. 18 shows how protrusions 120 may have multiple sub-protrusions to help ensure that no metal shorts are formed between lines 114.

Figure 19:
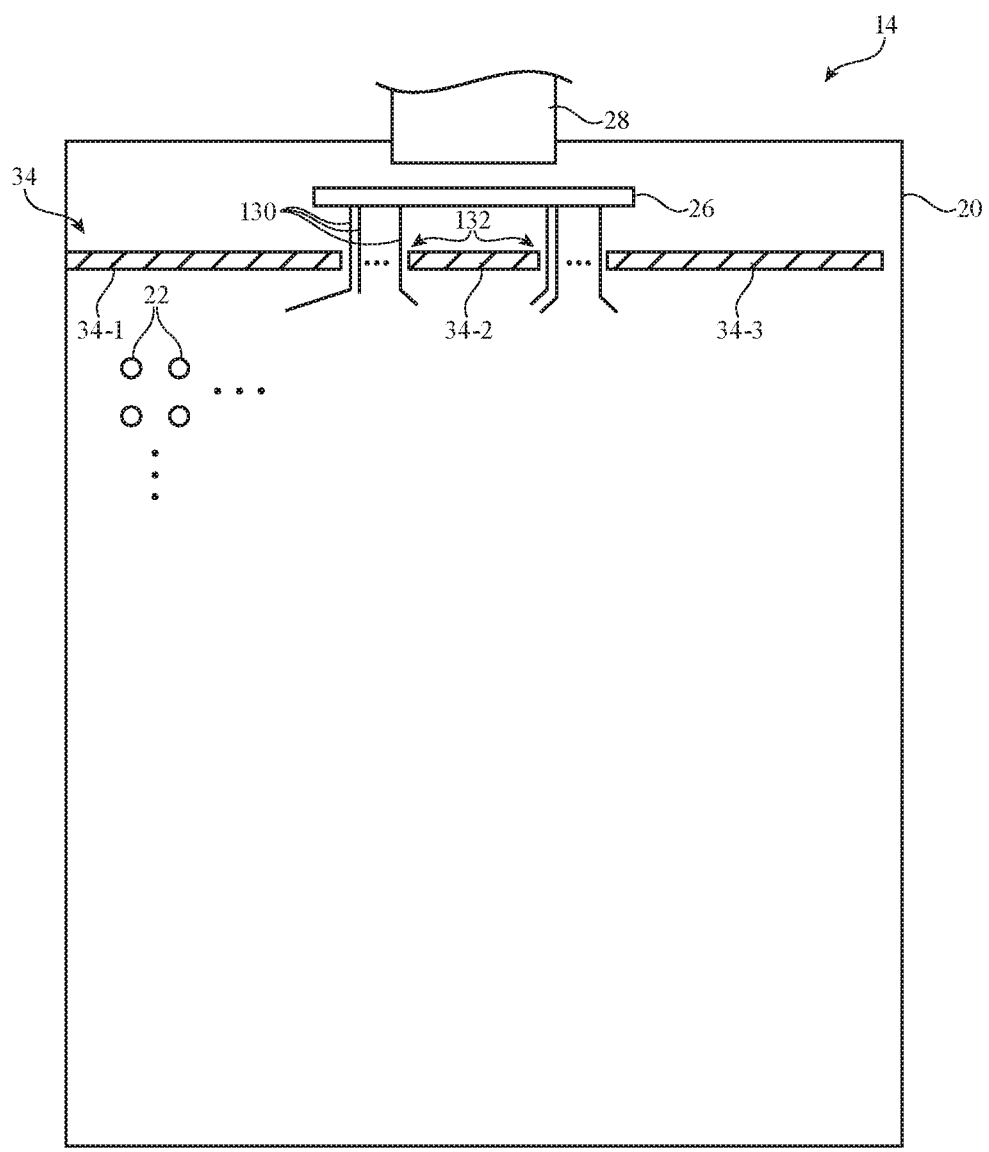
FIG. 19 is a top view of an illustrative display showing how a trench may have a segmented design with openings to accommodate metal signal lines in accordance with an embodiment.

FIG. 19 is a top view of display 14 in an illustrative configuration in which trench 34 has been divided into segments by non-trench regions 132. Conductive lines 130 (e.g., data lines D and/or other lines) may pass through regions 132 without traversing trench 34. In regions 132, none of the planarization layer material or only a portion of the planarization layer material of planarization layers 82 and/or 86 has been removed. This eliminates planarization layer steps (or at least reduces planarization layer step heights) and helps eliminate metal residues between adjacent conductive lines 130. There are two non-trench regions (regions 132) along the length of trench 34 in FIG. 19. These regions separate trench 34 into first trench segment 34-1, second trench segment 34-2, and third trench segment 34-3. In general, there may be one or more, two or more, three or more, or four or more regions such as regions 132 in which less planarization layer material has been removed than in trench 34 or in which no planarization layer material has been removed. The configuration of FIG. 19 is merely illustrative.

The foregoing is merely illustrative and various modifications can be made to the described embodiments. The foregoing embodiments may be implemented individually or in any combination.

What is claimed is:

1. Apparatus, comprising:
a substrate;
thin-film circuitry on the substrate that includes a first metal layer, a second metal layer, a third metal layer, a fourth metal layer, and planarization layer material, wherein the thin-film circuitry includes thin-film transistors having gates, areas of the first metal layer are patterned to form the gates, the thin-film transistor circuitry forms an array of display pixels on the substrate, the planarization layer material includes first and second planarization layers, the third metal layer is patterned to form lines that are between the first and second planarization layers, the first planarization layer has a step, and metal lines formed from the third metal layer run across the step;
a via in the thin-film circuitry that is formed from an opening in the planarization layer material and portions of the fourth metal layer that extend down sidewalls of the opening to a portion of the third metal layer, wherein a portion of the second metal layer is formed under the portion of the third metal layer and is contacted by the third metal layer, wherein a portion of the first metal layer forms a bump under the portion of the second metal layer, and wherein the portion of the first metal layer that forms the bump, the portion of the second metal layer, and the portion of the third metal layer are overlapped by the via; and
a dielectric layer interposed between the bump and the portion of the second metal layer.

2. The apparatus defined in claim 1 wherein the first planarization layer has protrusions each of which extends from a portion of the step that lies between a respective pair of the metal lines.

3. The apparatus defined in claim 2 wherein the step forms part of a trench in the first and second planarization layers and wherein the trench extends across the substrate.

4. The apparatus defined in claim 1 further comprising pads of indium tin oxide that form capacitive touch sensor electrodes.

5. The apparatus defined in claim 4, wherein the second metal layer has portions that form lines that short the pads to each other.

6. The apparatus defined in claim 1 wherein the third metal layer has portions that form data lines that supply data signals to the display pixels.

7. The apparatus defined in claim 1 wherein the step has protrusions, wherein at least one layer of the first, second, third, and fourth metal layers has portions forming metal lines, and wherein at least one of the protrusions is formed between each pair of the metal lines.

8. A display, comprising:
a substrate; and
thin-film circuitry on the substrate that includes display pixels with transistors, wherein the thin-film circuitry includes a first metal layer that forms gates for the transistors, a dielectric layer that covers the first metal layer, first and second planarization layers having a via opening for a via, a second metal layer on the dielectric layer having first metal lines and having a portion in the via, a third metal layer having second metal lines between the first and second planarization layers and having a portion in the via, and a fourth metal layer that extends down sidewalls in the via and that contacts the portion of the third metal layer in the via, wherein portions of the first and second planarization layers are removed to form a segmented trench having trench segments separated by an area in which the first and second planarization layers are not removed and wherein at least some of the second metal lines pass through the area between the trench segments.

9. The display defined in claim 8 wherein the portion of the third metal layer in the via contacts the portion of the second metal layer in the via.

10. The display defined in claim 9 wherein a portion of the dielectric layer is interposed between the first metal layer and the second metal layer.

11. The display defined in claim 10 further comprising a transparent conductive layer, wherein portions of the fourth metal layer extend from the via to the transparent conductive layer.

12. A touch screen display, comprising:
a substrate;
first and second polymer planarization layers, wherein at least the first polymer planarization layer forms a step;
metal lines that cross the step;
protrusions that extend from the step, wherein the metal lines include pairs of adjacent metal lines and wherein one of the protrusions is located between each pair of the adjacent metal lines;
an array of pixels on the substrate; and
capacitive touch sensor electrodes that overlap the pixels.

13. The touch screen display defined in claim 12 wherein the metal lines include data lines that distribute data to the pixels, wherein the capacitive touch sensor electrodes are formed from an indium tin oxide layer, and wherein a via is formed in the first and second polymer planarization layers that is coupled to one of the capacitive touch sensor electrodes, the touch screen display further comprising a gate metal layer having portions that form transistor gates and having a portion that forms a bump under the via.

* * * * *